United States Patent [19]

Gesemann et al.

[11] Patent Number: 5,320,667

[45] Date of Patent: Jun. 14, 1994

[54] COMBINATION OF AQUEOUS BATHS FOR ELECTROLESS GOLD DEPOSITION

[75] Inventors: Renate Gesemann, Chemnitz; Jurgen Spindler, Burgstadt; Falk Richter; Renate Broulik, both of Mittweida; Klaus Janotta, Berlin; Robert Ruther, Berlin; Manfred Dettke, Berlin, all of Fed. Rep. of Germany

[73] Assignee: Atotech Deutschland GmbH, Berlin, Fed. Rep. of Germany

[21] Appl. No.: 962,582

[22] PCT Filed: Jun. 13, 1991

[86] PCT No.: PCT/DE91/00498

§ 371 Date: Mar. 25, 1993

§ 102(e) Date: Mar. 25, 1993

[87] PCT Pub. No.: WO92/00398

PCT Pub. Date: Jan. 9, 1992

[30] Foreign Application Priority Data

Jun. 28, 1990 [DE] Fed. Rep. of Germany ....... 4020795

[51] Int. Cl.$^5$ ................ C23C 18/31; C23C 18/18

[52] U.S. Cl. .................. 106/1.23; 106/1.26

[58] Field of Search ............ 106/1.23, 1.26; 427/437

[56] References Cited

U.S. PATENT DOCUMENTS

| 4,978,559 | 12/1990 | Iacovangelo | 106/1.23 |
| 5,035,744 | 7/1991 | Nishiyama et al. | 106/1.23 |
| 5,130,168 | 7/1992 | Mathe et al. | 106/1.23 |

FOREIGN PATENT DOCUMENTS 219788 4/1987 European Pat. Off.

*Primary Examiner*—Helene Klemanski
*Attorney, Agent, or Firm*—Paul & Paul

[57] ABSTRACT

The invention relates to a combination of aqueous baths for electroless gold deposition and, preferably, for the deposition of gold onto nickel and nickel alloy films. The combination consists of a preliminary bath and a primary bath and, optionally, a pickling solution and a pretreatment. The gold film which is obtained is chip-bondable and wire-bondable.

20 Claims, No Drawings

COMBINATION OF AQUEOUS BATHS FOR ELECTROLESS GOLD DEPOSITION

The invention relates to a combination of aqueous baths for the electroless deposition of gold and the use of this combination.

The use of chemical-reductive metallization baths for the production of gold films is generally known (Goldie: 'Gold as a Surface; Technical and Decorative Gold Plating', 1983). Gold baths without an external current which contain the disulfitoaurate(I) anion are known from the publications DD-PS 150 762, DD-PS 240 915 or DD-PS 244 768. Furthermore, gold baths without an external current which contain potassium dicyanoaurate(I) are described in the publications DD-PS 273 651 or U.S. Pat. No. 3,506,462. Problems with gold plating occur when depositing on nickel-film surfaces. Either no deposition takes place on nickel or nickel alloy surfaces (U.S. Pat. No. 1,322,203) or it occurs in the form of a cementation deposition (U.S. Pat. No. 3,123,484) which permits only the deposition of thin gold films (DD-PS 265 915). A further disadvantage of cementation of the gold is that lengthy handling times lead to a worsening of the adhesion of the gold films.

Gold film thicknesses of 0.2–3.0 $\mu$m are required for chip or wire bonding. However, the electrolytes with a high deposition rate which are indicated for this are stable only to a limited extent (Rich, D. W.: Proc. Am. Elekctropl. [sic] Soc.; 1971, p. 58 and U.S. Pat. No. 4,169,171). Frequently, alkaline-soluble photoresists or photosensitive resists are used to mask surfaces that are not to be coated during selective coating tasks. Thus, gold electrolytes that work in the alkaline range at >pH 9 cannot be used (Dettke: 'Electroless Coating'; Eugen G. Leuze Verlag 1988, pp. 74–78). Similarly, a chemical-reductive gold bath with a high deposition rate is described in DD-PS 263 307. The disadvantage of this bath, however, is that a simultaneous cementative deposition process takes place.

The task which forms the basis of the present invention is to achieve a stable deposit of adherent, bondable gold film of >0.2 $\mu$m with particularly short deposition times.

According to the invention, this task is accomplished by a gold-electrolyte combination which consists of a pre-coating bath containing the disulfitoaurate(I) anion $[Au(SO_3)_2]^{3-}$ as a gold salt, an alkali metal sulfite and/or ammonium sulfite $(SO_3)^{2-}$ as a stabilizer, and a reducing agent, and a primary bath containing the dicyanoaurate(I) anion $[Au(CN)_2]^{-}$ as the gold salt, thiourea or its derivatives as stabilizers, and cobalt(II) salts, and, optionally, a complexing agent and, optionally, a nickel(II) salt.

The gold electrolyte contained in the pre-coating bath, disulfitoaurate(I), can be used in the form of its ammonium or alkali metal salts. Aldehyde and aldehyde-sulfite adducts are, for example, suitable as the reducing agents in the pre-coating bath. Formaldehyde (methanal) and the formaldehyde/sodium sulfite adduct (Rongalit ®) are especially suitable. The pre-coating bath may contain 0.3–2.0 g/l of gold as $Na_3Au(SO_3)_2$, 3–15 g/l of $Na_2SO_3$, 0.05–1.0 g/l of ethylenediamine, 0.1–0.5 g/l of formaldehyde, 10–25 g/l of $NH_4Cl$, and 5–25 g/l of a salt of a hydroxycarboxylic acid.

If required, a complexing agent, such as ethylenediamine, can also be added to the pre-coating bath.

The gold anion used in the primary bath, dicyanoaurate(I), can also be used in the form of its ammonium or alkali metal salts. Thiourea or its derivatives are added to the primary bath as stabilizers, for example thiosemicarbazide. Cobalt(II) salts, for example cobalt(II) halides, cobalt(II) sulfate, cobalt(II) nitrate, cobalt(II) formate or cobalt(II) acetate are added to the electrolyte as an essential component of the primary bath.

If required, a nickel salt, for example a nickel(II) halide, with nickel(II) chloride being especially advantageous, can be added to the primary bath in order to increase the rate of deposition. The primary bath may contain 3–10 g/l of $KAu(CN)_2$, 5–25 g/l of thiourea, 10–30 g/l of $CoCl_2.6H_2O$, 5–15 g/l of $NiCl_2.6H_2O$, and 10–30 g/l of an ammonium salt of a hydroxycarboxylic acid.

In order to coat nickel or nickel alloy surfaces, it can be necessary, in addition, to use a pickling solution. This pickling solution consists of a hydroxycarboxylic acid or its salts and ammonium chloride. Tartaric acid or citric acid are, for example, suitable as hydroxy acids. A pickling solution containing 1–10 g/l of a hydroxycarboxylic acid or its salts and 5–25 g/l of $NH_4Cl$ may be used.

The pickling solution is to be used if the nickel or nickel alloy surface which is present shows high cementation during coating with gold; additional dissolution of the nickel film occurs because of the acidic electrolyte solution. Solutions of the alkali metal salts of carboxylic acids or the ammonium salts of carboxylic acids, such as sodium citrate with ammonium chloride at pH 6–8 passivate nickel surfaces or nickel alloy surfaces and nickel film surfaces. The cementation rate is reduced as a result of this.

A 'gold-strike electrolyte' working in the neutral range up to a maximum pH of 8, which also contains an alkali metal salt of a carboxylic acid or an ammonium salt of a carboxylic acid and ammonium chloride, ensures adherent depositions of gold films. There is no additional dissolution of the passive nickel films (for example, selectively underneath the gold films). The leak-proof preliminary gold film protects the nickel surface from selective dissolution in the acidic primary gold electrolyte. The acidic primary gold electrolyte is additionally stabilized by the use of thiourea or its derivatives whereby, in the case of permanent stability, an acceleration of the catalytic reduction reaction—and thus a deposition rate of 2 $\mu$m/h—is achieved by means of an adjusted concentration of nickel ions (nickel chloride) in the electrolyte.

The initial reaction in depositing the primary gold layer can be accelerated by a pretreatment solution in the case of additional gold plating onto gold and/or gold-plated surfaces. The pretreatment solution consists of heavy metal ions, e.g. $Ni^{2+}$ ions in an acidic medium, which are adsorbed at the gold surface and change the surface potential. A 10–30 g/l $NiCl_2.6H_2O$ and 5–15 g/l $CoCl_2.6H_2O$ pretreatment solution may be used that has been heated to 60°–90° C.

The invention further relates to a process for gold deposition using the electrolyte combination according to the invention and, optionally, the pickling solution.

Examples of embodiments:

EXAMPLE 1

The subject matter of the invention is especially well-suited to the deposition of gold films on ceramic chip carrier housings that have been made conductive. In this process, they are metallized with chemical-reductive nickel-phosphorus films and gold (2-3 μm) as the external film contact system.

The nickel-phosphorus film is first treated with the following pickling solution for 30 hours at room temperature:

10 g/l sodium citrate
15 g/l ammonium chloride

Gold plating is then performed with the combination according to the invention.

| a) Pre-coating gold electrolyte bath: 30 minutes at 60° C. | |
| --- | --- |
| Gold as Na₃Au(SO₃)₂ | 0.6 g/l |
| Formaldehyde | 0.1 g/l |
| Sodium citrate | 10.0 g/l |
| Na₂SO₃ | 5.0 g/l |
| Ethylenediamine | 0.84 g/l |
| NH₄Cl | 15.0 g/l |
| b) Primary gold electrolyte: 90 minutes at 82–84° C. | |
| KAu(CN)₂ | 5.0 g/l |
| Thiourea | 24.8 g/l |
| CoCl₂.6H₂O | 20.0 g/l |
| NiCl₂.6H₂O | 10.0 g/l |
| Ammonium dihydrogen citrate | 20.0 g/l |

During incipient alloying of the chip on the chip-bond surface, a eutectic coverage of >75% was achieved. The tear resistance of the chip was greater than 20N. With ultrasound wire bonds, high resistance levels were achieved in regard to the connecting wires (pull test 9.2±1.1 cN).

EXAMPLE 2

A miniature printed circuit board partially covered with "Riston 3615 ®" alkaline-soluble fixed resist is to be selectively gold-plated on existing, chemically reduced nickel-plated copper contact-film structures. The pickling solution used was the same as in Example 1. Gold plating then follows with the following combination in accordance with the invention:

| a) Pre-coating gold electrolyte bath: 15 minutes, 60° C., pH 5.1 with citric acid | |
| --- | --- |
| Gold as (NH₄)₃Au(SO₃)₂ | 1.0 g/l |
| Formaldehyde | 0.15 g/l |
| Sodium citrate | 15.0 g/l |
| Na₂SO₃ | 7.0 g/l |
| Ethylenediamine | 0.84 g/l |
| NH₄Cl | 10.0 g/l |
| b) Primary gold electrolyte: 30 minutes, 82–84° C. | |
| KAu(CN)₂ | 4.0 g/l |
| Thiourea | 20.0 g/l |
| CoCl₂.6H₂O | 20.0 g/l |
| NiCl₂.6H₂O | 15.0 g/l |
| Ammonium dihydrogen citrate | 15.0 g/l |

The adhesive strength of the $Ni_xP_y$-Au film system amounted to 1300N/cm² in the frontal pulling test. The au wires (φ20 μm) which had been bonded using the Thermosonic process showed tear resistances of 9.1±1.3 cN (pull test). The Au films are capable of soldering by reflow techniques (checked with the printed circuit board bending test).

EXAMPLE 3

A line circuit on $Al_2O_3$ ceramic is to be built with the film system $Ni_xP_y$-galv. Cu - $Ni_xP_y$-Au. The conductor structure incl. galv. copper is first produced with the lift-off technique. After removing the photosensitive resist, the film system $Ni_xP_y$-galv. copper is coated with $Ni_xP_y$ from an alkaline electrolyte and gold-plated with the combination as follows which is in accordance with the invention:

| a) Pre-coating gold electrolyte bath: 30 minutes, 60° C. analogously to Example 2, but with | | |
| --- | --- | --- |
| Gold as (NH₄)₃Au(SO₃)₂ | 1.2 g/l | |
| Ammonium dihydrogen citrate | 20.0 g/l | (instead of sodium citrate) |
| b) Pretreatment solution for the gold: 4 minutes, 82–84° C. | | |
| NiCl₂.6H₂O | 15.0 g/l | |
| CoCl₂.6H₂O | 20.0 g/l | |
| dissolved in 15% hydrochloric acid | | |
| c) Primary gold electrolyte: 30 minutes, 82–84° C. | | |
| KAu(CN)₂ | 7.0 g/l | |
| Thiourea | 25.0 g/l | |
| CoCl₂.6H₂O | 15.0 g/l | |
| NiCl₂.6H₂O | 15.0 g/l | |
| Ammonium dihydrogen citrate | 20.0 g/l | |

The adhesive strength of the film system amounted to 1800±100N/cm² (frontal pull test).

EXAMPLE 4

A $Ni_xP_y$ structure is produced from an alkaline electrolyte on $Al_2O_3$ ceramic by means of laser metallization. This structure is to be gold-plated in order to create wire bonding islands.

A special pickling solution is not used.

The gold plating is then performed with the combination in accordance with the invention.

| a) Pre-coating gold electrolyte bath: 15 minutes, 60° C. | |
| --- | --- |
| Gold as (NH₄)₃Au(SO₃)₂ | 2.0 g/l |
| Formaldehyde | 0.1 g/l |
| Sodium citrate | 10.0 g/l |
| Na₂SO₃ | 5.0 g/l |
| Ethylenediamine | 0.84 g/l |
| NH₄Cl | 15.0 g/l |
| b) Primary gold electrolyte: 30 minutes, 82–84° C., pH 5 with NH₄OH | |
| KAu(CN)₂ | 5.0 g/l |
| Thiourea | 24.8 g/l |
| CoCl₂.6H₂O | 20.0 g/l |
| NiCl₂.6H₂O | 10.0 g/l |
| Ammonium dihydrogen citrate | 20.0 g/l |

The IC chip is attached by gluing.

The ultrasound bonding of the $Ni_xP_y$-Au film system with 25 μm AlSil wires yielded adhesive strengths of 7.5±0.6 cN (pull test).

What is claimed is:

1. Combination of aqueous baths for electroless gold deposition comprising a pre-coating bath and a primary bath, wherein the pre-coating bath comprises a disulfitoaurate(I) anion of the formula $(Au(SO_3)_2)^{3-}$, a stabilizer selected from the group consisting of alkali metal sulfite, ammonium sulfite and mixtures thereof, a reducing agent and a complexing agent, and the primary bath comprises a dicyanoaurate(i) anion of the formula $(Au(CN)_2)^-$, cobalt(II) salts and thiourea.

2. Combination in accordance with claim 1, wherein the primary bath also contains nickel(II) salts.

3. Combination in accordance with any one of claim 1-2, wherein the pre-coating bath contains 0.3-2.0 g/l of gold as Na₃Au(SO₃)₂, 3-15 g/l of Na₂SO₃, 0.05-1.0 g/l of ethylenediamine, 0.1-0.5 g/l of formaldehyde, 10-25 g/l of NH₄Cl, and 5-25 g/l of a salt of a hydroxycarboxylic acid.

4. Combination in accordance with any one of claim 1-2, wherein the primary bath contains 3-10 g/l of KAu(CN)$_2$, 5-25 g/l of thiourea, 10-30 g/l of CoCl$_2$.6H$_2$O, 5-15 g/l of NiCl$_2$.6H$_2$O, and 10-30 g/l of an ammonium salt of a hydroxycarboxylic acid.

5. Combination in accordance with claim 3, wherein the primary bath contains 3-10 g/l of KAu(CN)$_2$, 5-25 g/l of thiourea, 10-30 g/l of CoCl$_2$.6H$_2$O, 5-15 g/l of NiCl$_2$.6H$_2$O, and 10-30 g/l of an ammonium salt of a hydroxycarboxylic acid.

6. Process for the electroless deposition of gold onto a Ni or Ni alloy surface comprising:
   (a) treating the surface with a pickling solution comprising a hydroxycarboxylic acid or salt thereof and NH$_4$Cl;
   (b) contacting the surface with a pre-coating bath comprising a disulfitoaurate(I) anion of the formula (Au(SO$_3$)$_2$)$^{3-}$, a stabilizer selected from the group consisting of alkali metal sulfite, ammonium sulfite and mixtures thereof, a reducing agent and a complexing agent; and
   (c) contacting the surface with a primary bath comprising a dicyanoaurate(I) anion of the formula (Au(CN)$_2$)$^-$, cobalt(II) salts and thiourea.

7. Process in accordance with claim 6, wherein the primary bath also contains nickel(II) salts.

8. Process in accordance with claim 6, wherein the pickling solution comprises 1-10 g/l of hydroxycarboxylic acid or salt thereof and 5-25 g/l of NH$_4$Cl.

9. Process in accordance with claim 7, wherein the pickling solution comprises 1-10 g/l of hydroxycarboxylic acid or salt thereof and 5-25 g/l of NH$_4$Cl.

10. Process in accordance with claim 6, further comprising the step of pre-treating the surface with an acidic solution comprising Ni(II) ions, Co(II) ions or mixtures thereof prior to contacting the surface with the primary bath.

11. Process in accordance with claim 7, further comprising the step of pre-treating the surface with an acidic solution comprising Ni(II) ions, Co(II) ions or mixtures thereof prior to contacting the surface with the primary bath.

12. Process in accordance with claim 10, wherein the acidic pre-treating solution comprises 10-30 g/l of NiCl$_2$.H$_2$O and 5-15 g/l of CoCl$_2$.6H$_2$O and is heated to 60°-90° C.

13. Process in accordance with claim 12, wherein the acidic pre-treating solution comprises 10-30 g/l of NiCl$_2$.H$_2$O and 5-15 g/l of CoCl$_2$.6H$_2$O and is heated to 60°-90° C.

14. Process in accordance with claim 6, wherein the pre-coating bath contains 0.3-2.0 g/l of gold as Na$_3$Au(SO$_3$)$_2$, 3-15 g/l of Na$_2$SO$_3$, 0.05-1.0 g/l of ethylenediamine, 0.1-0.5 g/l of formaldehyde, 10-25 g/l of NH$_4$Cl and 5-25 g/l of a salt of a hydroxycarboxylic acid.

15. Process in accordance with claim 7, wherein the pre-coating bath contains 0.3-2.0 g/l of gold as Na$_3$Au(SO$_3$)$_2$, 3-15 g/l of Na$_2$SO$_3$, 0.05-1.0 g/l of ethylenediamine, 0.1-0.5 g/l of formaldehyde, 10-25 g/l of NH$_4$Cl and 5-25 g/l of a salt of a hydroxycarboxylic acid.

16. Process in accordance with claim 6, wherein the primary bath contains 3-10 g/l of KAu(CN)$_2$, 5-25 g/l of thiourea, 10-30 g/l of CoCl$_2$.6H$_2$O, 5-15 g/l of NiCl$_2$.6H$_2$O and 10-30 g/l of an ammonium salt of a hydroxycarboxylic acid.

17. Process in accordance with claim 7, wherein the primary bath contains 3-10 g/l of KAu(CN)$_2$, 5-25 g/l of thiourea, 10-30 g/l of CoCl$_2$.6H$_2$O, 5-15 g/l of NiCl$_2$.6H$_2$O and 10-30 g/l of an ammonium salt of a hydroxycarboxylic acid.

18. Process for the electroless deposition of gold onto a surface comprising:
   (a) contacting the surface with a pre-coating bath comprising 0.3-2.0 g/l of gold as Na$_3$Au(SO$_3$)$_2$, 3-15 g/l of Na$_2$SO$_3$, 0.05-1.0 g/l of ethylenediamine, 0.1-0.5 g/l of formaldehyde, 10-25 g/l of NH$_4$Cl and 5-25 g/l of a salt of a hydroxycarboxylic acid;
   (b) pre-treating the surface with an acidic solution comprising Ni(II) ions, Co(II) ions or mixtures thereof; and
   (c) contacting the surface with a primary bath comprising a dicyanoaurate(I) anion of the formula (Au(CN)$_2$)$^-$, cobalt(II) salts and thiourea.

19. Process in accordance with claim 18, wherein the primary bath also contains nickel(II) salts.

20. Process for the electroless deposition of gold onto a surface comprising:
   (a) contacting the surface with a pre-coating bath comprising a disulfitoaurate(I) anion of the formula (Au(SO$_3$)$_2$)$^{3-}$, a stabilizer selected from the group consisting of alkali metal sulfite, ammonium sulfite and mixtures thereof, a reducing agent and a complexing agent;
   (b) pre-treating the surface with an acidic solution comprising Ni(II) ions, Co(II) ions or mixtures thereof; and
   (c) contacting the surface with a primary bath comprising 3-10 g/l of KAu(CN)$_2$, 5-25 g/l of thiourea, 10-30 g/l of CoCl$_2$.6H$_2$O, 5-15 g/l of NiCl$_2$.6H$_2$O and 10-30 g/l of an ammonium salt of a hydroxycarboxylic acid.

* * * * *